United States Patent
Yamamoto

(10) Patent No.: US 7,718,346 B2
(45) Date of Patent: May 18, 2010

(54) METHOD OF FORMING WIRING PATTERN AND METHOD OF MANUFACTURING TFT SUBSTRATE USING THE SAME

(75) Inventor: Yuji Yamamoto, Kagoshima (JP)

(73) Assignee: NEC LCD Technologies, Ltd., Kawasaki, Kanagawa (JP)

( * ) Notice: Subject to any disclaimer, the term of this patent is extended or adjusted under 35 U.S.C. 154(b) by 613 days.

(21) Appl. No.: 11/193,457

(22) Filed: Aug. 1, 2005

(65) Prior Publication Data

US 2006/0021963 A1      Feb. 2, 2006

(30) Foreign Application Priority Data

Aug. 2, 2004    (JP) .............................. 2004-225553

(51) Int. Cl.
*G03F 7/26*    (2006.01)
(52) U.S. Cl. ...................................... 430/311
(58) Field of Classification Search ................. 430/311, 430/315, 319, 324, 330
See application file for complete search history.

(56) References Cited

U.S. PATENT DOCUMENTS

| | | | |
|---|---|---|---|
| 2002/0171085 A1* | 11/2002 | Suzawa et al. | 257/72 |
| 2003/0185971 A1* | 10/2003 | Saksa et al. | 427/96 |
| 2003/0186170 A1* | 10/2003 | Yamashita | 430/311 |
| 2004/0164294 A1* | 8/2004 | Son et al. | 257/40 |
| 2004/0185363 A1* | 9/2004 | Kidokoro | 430/108.21 |

FOREIGN PATENT DOCUMENTS

| | | |
|---|---|---|
| JP | 03-049237 | 3/1991 |
| JP | 05-291726 | 11/1993 |
| JP | 08-250397 | * 9/1996 |
| JP | 8-250397 | 9/1996 |
| JP | 09-064339 | 3/1997 |
| JP | 9-138509 | 5/1997 |
| JP | 2002-110631 | 4/2002 |
| JP | 2002-268585 | 9/2002 |
| JP | 2002-341376 | 11/2002 |
| JP | 2003-282422 | 10/2003 |

OTHER PUBLICATIONS

Japanese Office Action dated Nov. 11, 2008 with Partial English Translation.

* cited by examiner

*Primary Examiner*—Kathleen Duda
*Assistant Examiner*—Brittany Raymond
(74) *Attorney, Agent, or Firm*—McGinn IP Law Group PLLC

(57) ABSTRACT

A method of forming a wiring pattern includes forming a first conductive film pattern, an insulating film and a second conductive film pattern intersecting with the first conductive film pattern on an insulating substrate. In the method, an etching resist pattern for forming the second conductive film pattern is formed by use of a screen printing method. Thereafter, an etching resist is softened by exposing the etching resist in an organic solvent atmosphere before hardening thereof. Thus, defects such as spaces in the etching resist are repaired. By use of the above-described method of forming a wiring pattern, a TFT substrate is manufactured.

16 Claims, 9 Drawing Sheets

METHOD OF FORMING WIRING PATTERN AND METHOD OF MANUFACTURING TFT SUBSTRATE USING THE SAME

BACKGROUND OF THE INVENTION

1. Field of the Invention

The present invention relates to a method of forming a wiring pattern and a method of manufacturing a thin film transistor (TFT) substrate using the same. More particularly, the present invention relates to a method of forming a wiring pattern by use of a screen printing method, and a method of manufacturing a TFT substrate using the same.

2. Description of the Related Art

In a color liquid crystal display panel of a color liquid crystal display, manufacturing of a high-definition panel has been underway. For manufacturing of the high-definition panel, conventionally, there has been adopted a method of narrowing a pitch between pixels of a color filter and a thin film transistor (TFT) and reducing a line width of a black matrix (BM) of the color filter and line widths of a data line and a gate line of the TFT.

Moreover, in manufacturing of the color liquid crystal display panel, manufacturing of a TFT substrate occupies about 60 to 70% of manufacturing lead-time.

Thus, from the aspect of reducing the manufacturing lead-time of the color liquid crystal display panel, there has been strongly demanded reduction of the manufacturing lead-time including review of a method of manufacturing the TFT substrate.

Generally, the TFT substrate is manufactured in such a manner that, after required kinds of films such as a metal film and a semiconductor film are deposited on a glass substrate, etching and patterning of the metal film and the semiconductor film are repeated by use of a method called photolithography. In the method of manufacturing the TFT substrate, utility factor for a photoresist used as a protective film in etching of the metal film and the semiconductor film is very small. Specifically, the photoresist is applied onto the entire surfaces of the metal film and the semiconductor film which are deposited on the glass substrate, and is patterned to have shapes of a wiring and an electrode by exposure and development. In this event, the photoresist left as the protective film is less than 1% of the photoresist applied. In other words, less than 1% of the photoresist is used and the rest is discarded. As a result, the photoresist formation process is a cause of an increase of the manufacturing cost. Moreover, the TFT substrate is manufactured by repeating the steps of forming kinds of films required for a pattern and of applying, exposing, developing and etching a resist. Thus, manufacturing lead-time is increased.

In order to solve the foregoing problems, there has been disclosed a method of forming required kinds of films on the entire surface of a glass substrate and then printing a resist directly in a pattern of an electrode and a wiring on the films.

For example, Japanese Patent Laid-Open No. 2002-341376 (hereinafter referred to as Patent Document 1) discloses a technology of printing a resin (toner) containing metal particles onto a substrate by use of electrophotography using a photoconductor drum, and then forming a gate electrode of a substrate for a semiconductor element (a TFT substrate) by breaking down the resin at a high temperature.

Moreover, Japanese Patent Laid-Open No. 2002-268585 (hereinafter referred to as Patent Document 2) discloses a technology of forming a gate electrode of an active matrix substrate used in a liquid crystal display or the like by forming a resist pattern by use of an intaglio offset printing method and etching a metal film.

However, the technologies described above can only be applied to a relatively large pattern. For example, it has been difficult to apply the technologies to a TFT substrate which enables high-definition display such as that demanded in market. Moreover, there has been considered a method of forming a wiring pattern of a TFT substrate by use of an etching resist formed by a screen printing method.

A method of manufacturing a TFT substrate will be described, which uses a conventional screen printing method to form an etching resist for wiring formation.

FIGS. 1A and 1B are cross-sectional views of a main part of a substrate, showing the method of manufacturing a TFT substrate, which uses the conventional screen printing method to form the etching resist for wiring formation. As shown in FIG. 1A, a first wiring pattern 702 is formed on a glass substrate 701. Next, by use of a sputtering method, a CVD method or the like, a wiring metal film 704 for a second wiring pattern such as an electrode and a semiconductor layer is formed on the first wiring pattern 702 with an interlayer insulating film 703 interposed therebetween. Thereafter, a resist pattern 705 is formed by use of the screen printing method. Subsequently, the entire structure including the glass substrate 701 is baked in a furnace or the like to harden the resist pattern 705.

Next, an unnecessary portion of the wiring metal film 704 on the glass substrate 701 is removed by etching. Thereafter, the resist pattern 705 is removed by use of a stripping agent.

Accordingly, a multilayer wiring of the TFT substrate is formed by sequentially repeating the steps of forming an interlayer insulating film and a wiring metal film, forming a resist pattern and etching.

In the conventional method of manufacturing a TFT substrate as described above, if a pattern is printed in a step part 708 formed by intersection of wirings, as shown in FIG. 1A, spaces 706 may be generated under the resist pattern 705. The spaces 706 are generated because a resist used for printing normally has a viscosity higher than that of a resist for a spin coater used in an application step of a usual photoresist method and the like, and has a poor coating coverage for irregularities, step portions and the like.

Accordingly, as shown in FIG. 1B, in the step portion, a defective part 707 is likely to be caused by cutting-off of the resist pattern 705. As a result, a portion of the wiring metal film, which should normally be left behind, is also etched by the subsequent etching step. Thus, a wiring defect or disconnection occurs.

SUMMARY OF THE INVENTION

The present invention was made to solve the foregoing problems of the conventional method of forming a wiring of a TFT substrate and the like.

It is an object of the present invention to provide a method of forming a resist pattern for etching, which intersects with a base wiring, and an upper layer wiring pattern made of a conductive paste by use of a screen printing technology. Moreover, it is the object of the present invention to provide a method of manufacturing a TFT substrate by use of the method described above.

A first aspect of a method of forming a wiring pattern of the present invention includes forming a first conductive film pattern made of a first conductive film on an insulating substrate; and forming a second conductive film pattern made of a second conductive film, which intersects with the first conductive film pattern, on the first conductive film pattern with an insulating film interposed therebetween. Forming the second conductive film pattern includes forming the insulating film covering the first conductive film pattern on the entire surface of the insulating substrate having the first conductive film pattern formed thereon, and forming the second conductive film on the insulating film. Moreover, forming the second conductive film pattern further includes forming a resist pattern, which interests with the first conductive film pattern, on the second conductive film by use of a screen printing method, softening the resist pattern after drying the resist pattern, hardening the resist pattern, and forming the second conductive film pattern, which intersects with the first conductive film pattern, by etching and patterning the first conductive film by use of the resist pattern as a mask.

In the first aspect of the method of forming a wiring pattern of the present invention described above, softening the resist pattern includes a step of exposing the resist pattern in an organic solvent atmosphere or heat-treating the resist pattern at a temperature lower than a curing temperature of a resist material of the resist pattern.

A second aspect of a method of forming a wiring pattern of the present invention includes: forming a first conductive film pattern made of a first conductive film on an insulating substrate; and forming a second conductive film pattern made, of a second conductive film, which intersects with the first conductive film pattern, on the first conductive film with an insulating film interposed therebetween. Forming the second conductive film pattern includes forming the insulating film covering the first conductive film pattern on the entire surface of the insulating substrate having the first conductive film pattern formed thereon, forming the second conductive film pattern, which intersects with the first conductive film pattern, by screen-printing a conductive paste on the insulating film, softening the second conductive film pattern after drying the second conductive film pattern, and hardening the second conductive film pattern.

In the second aspect of the method of forming a wiring pattern of the present invention described above, softening the second conductive film pattern includes exposing the second conductive film pattern in an organic solvent atmosphere or heat-treating the second conductive film pattern at a temperature lower than a curing temperature of the conductive paste of the second conductive film pattern.

A first aspect of a method of manufacturing a TFT substrate of the present invention includes: forming a gate wiring on an insulating substrate; forming a gate insulating film, which covers the gate wiring, on the insulating substrate; depositing a semiconductor film on the gate insulating film, and forming a semiconductor film pattern by etching and patterning the semiconductor film; and depositing a metal film, which covers the semiconductor film pattern, on the gate insulating film, and forming source and drain electrodes made of the metal film connected to the semiconductor film pattern by etching and patterning the metal film. At least one of etching resist patterns of the semiconductor film and the metal film is formed by screen printing and is softened after dried before hardening thereof is performed.

In the first aspect of the method of manufacturing a TFT substrate of the present invention described above, softening the etching resist pattern includes exposing the etching resist pattern in an organic solvent atmosphere or heat-treating the etching resist pattern at a temperature lower than a curing temperature of a resist material of the etching resist pattern.

A second aspect of the method of manufacturing a TFT substrate of the present invention includes: forming a gate wiring on an insulating substrate; forming a gate insulating film, which covers the gate wiring, on the insulating substrate; forming a semiconductor film pattern on the gate insulating film; and forming source and drain electrodes containing a metal material connected to the semiconductor film pattern on the gate insulating film. Forming the source and drain electrodes includes forming a conductive film pattern by screen-printing a conductive paste on the semiconductor film pattern, softening the conductive film pattern after drying thereof, and hardening the conductive film pattern.

In the second aspect of the method of manufacturing a TFT substrate of the present invention described above, softening the conductive film pattern includes exposing the conductive film pattern in an organic solvent atmosphere or heat-treating the conductive film pattern at a temperature lower than a curing temperature of the conductive paste of the conductive film pattern.

In the method of forming a wiring pattern of the present invention, in the case where an upper wiring which interests with a lower wiring pattern is formed, an etching resist pattern is formed by screen printing and, thereafter, softened. This softening of the pattern enables repair of defects such as spaces which are formed on a step part of a conductive film for the upper wiring, the step part being formed due to the lower wiring pattern, and which are generated in the etching resist pattern. As a result, it is possible to prevent occurrence of defects such as disconnection and a wiring defect of a portion of the upper wiring which intersects with the lower wiring.

In the method of forming a wiring pattern of the present invention, after an upper wiring which intersects with a lower wiring is formed by screen-printing a conductive paste, the conductive paste is softened by exposing the conductive paste in an organic solvent atmosphere or the like before hardening thereof. By the softening of the conductive paste, defects such as spaces generated in a portion of the upper wiring, which intersects with the lower wiring, are repaired.

In the method of manufacturing a TFT substrate of the present invention, by adopting the above-described method of forming a wiring pattern of the present invention, an amount of the etching resist used can be reduced, and manufacturing lead-time for the TFT substrate can also be shortened. In the present invention, the upper wiring can be formed by screen printing using a conductive paste as a wiring material. Thus, the manufacturing lead time for the TFT substrate can be further shortened.

BRIEF DESCRIPTION OF THE DRAWINGS

The above and other objects, features and advantages of the present invention will become more apparent from the following detailed description when taken in conjunction with the accompanying drawings wherein.

DETAILED DESCRIPTION OF THE PREFERRED EMBODIMENTS

In a method of forming a resist pattern of the present invention, a screen printing method is used to form a resist pattern in the case where a second wiring, which intersects with a first wiring on an insulating substrate, is formed by etching on the first wiring with an insulating film interposed therebetween.

In the method of forming a resist pattern of the present invention, after the resist pattern is formed by use of the screen printing method, the resist pattern is either exposed in an organic solvent atmosphere or softened by heat treatment or the like.

By use of the above-described method of forming a resist pattern, manufacturing costs of a TFT substrate can be reduced and manufacturing lead time can be shortened. Hereinafter, with reference to the drawings, concrete description will be given of embodiments of the method of forming a resist pattern and a method of manufacturing a TFT substrate by use of the method described above according to the present invention.

Typical Embodiment 1

Figure 1A:
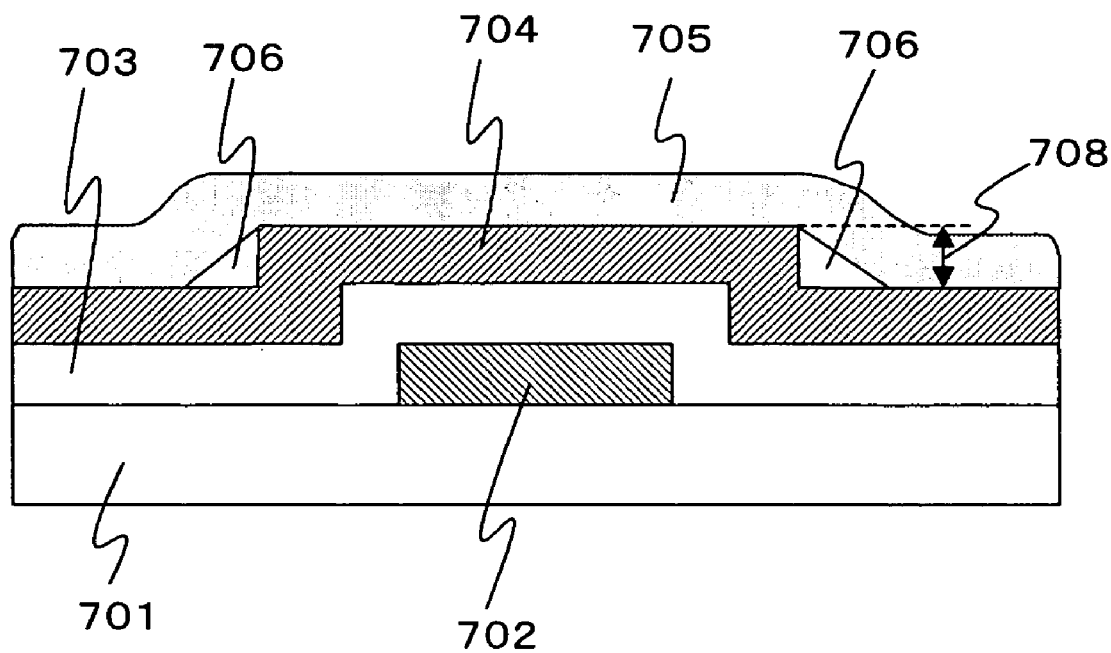
FIGS. 1A and 1B are cross-sectional views of a main part of a substrate, showing a method of manufacturing a TFT substrate, which uses a conventional screen printing method to form an etching resist for wiring formation.
Figure 1B:
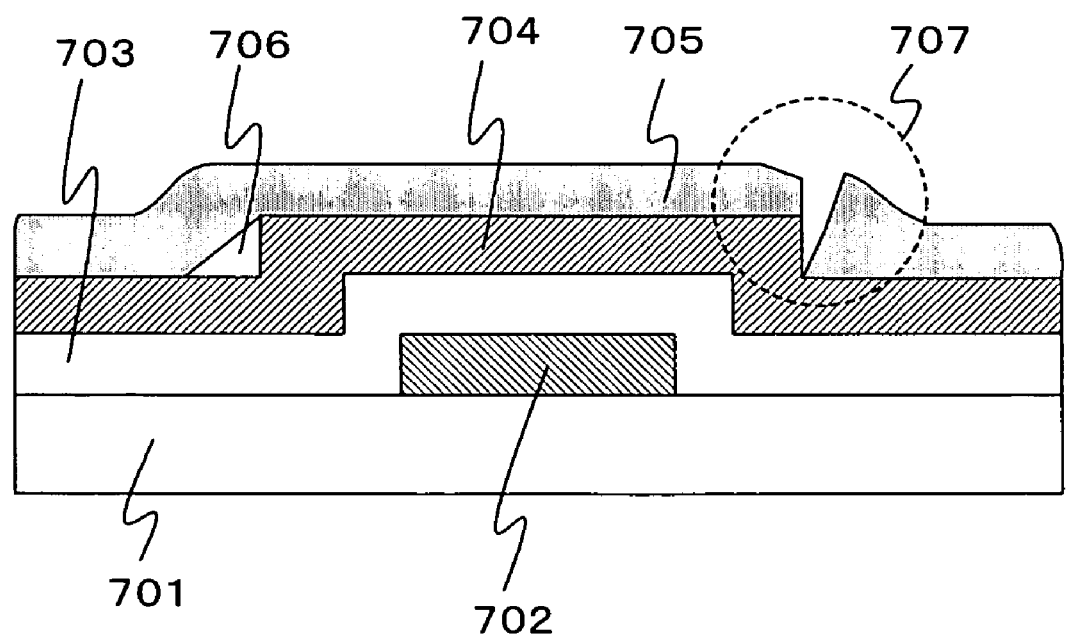
Figure 2A:
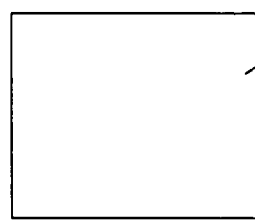
FIGS. 2A to 2G are plan views of a main part of a substrate, showing a method of forming a wiring according to a first typical embodiment of the present invention.
Figure 2B:
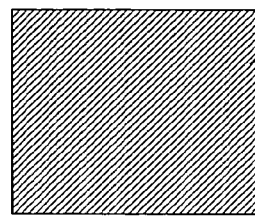

FIGS. 2A to 2F are plan views of a main part of a substrate, showing steps of a method of forming a wiring according to a first typical embodiment of the present invention. First, as shown in FIG. 2A, an insulating substrate 101 such as a glass substrate is prepared. Next, as shown in FIG. 2B, a first wiring metal film 102 is deposited on the entire surface of the insulating substrate 101. As the first wiring metal film 102, a laminated film can be used, which is formed of one selected from a group including Cr, Ta, Mo and Ti, and an aluminum alloy film such as Al—Nd and Al—Ta.

The first wiring metal film 102 has a thickness of 200 nm to 1000 nm.

Figure 2C:
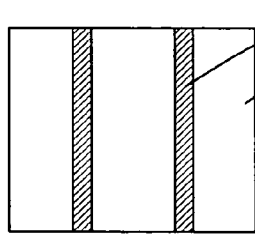
Figure 2D:
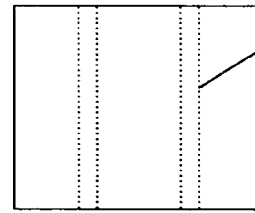

Next, as shown in FIG. 2C, an unnecessary portion of the wiring metal film 102 is etched by wet etching or dry etching using a resist as a mask, and a first wiring pattern 103 is formed. Next, as shown in FIG. 2D, an insulating film 104 having a thickness of 200 to 1000 nm is deposited on the entire surface of the insulating substrate 101 having the first wiring pattern 103 formed thereon. As the insulating film 104, a nitride film or an oxide film is used.

Figure 2E:
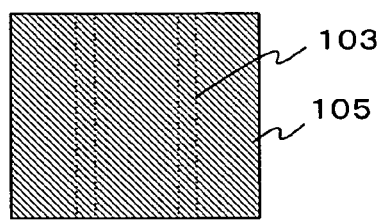
Figure 2F:
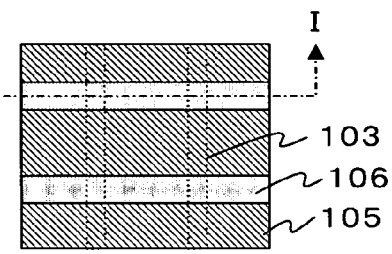

Thereafter, as shown in FIG. 2E, a second wiring metal film 105 having a thickness of 30 to 400 nm is deposited on the entire surface of the insulating film. As the second wiring metal film 105, for example, Al, Mo or Cr can be used. Furthermore, as shown in FIG. 2F, a resist pattern 106 which intersects with the wiring pattern 103 and has a thickness of 2 to 5 μm is formed by screen printing on the second wiring metal film 105. For a resist material of the resist pattern, thermosetting resin ink is used. Thereafter, a solvent in the resist pattern 106 is vaporized by air drying, and the resist pattern 106 is dried. In order to hasten drying of the resist pattern 106, the resist pattern 106 can also be dried by heating at a temperature of 30 to 50° C. in a drying furnace. Next, the resist pattern 106 is softened.

As a method of softening the resist pattern 106, any one of the following two methods can be used. Specifically, one is a solvent exposure processing method of exposing the insulating substrate 101 in an organic solvent atmosphere of about 0.01% to 10% for about 10 to 120 seconds. The other one is a heat treatment method of holding the insulating substrate 101 at a temperature lower than a curing temperature of the resist material, for example, at a high temperature of about 50 to 100° C. for about 10 to 120 seconds. In a portion of the resist pattern 106 which intersects with the first wiring pattern 103, a space is likely to be generated. However, the space generated in the portion of the resist pattern 106 which intersects with the first wiring pattern 103 is eliminated by the softening described above. After the softening, the resist pattern 106 is hardened. Thereafter, the second wiring metal film 105 is etched by use of the resist pattern 106 as a mask.

Figure 2G:
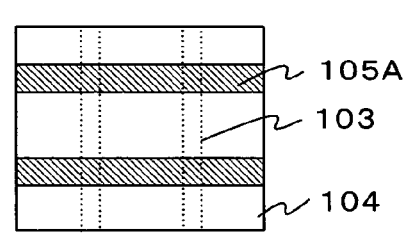

Thus, as shown in FIG. 2G, a second wiring pattern 105A is similarly formed by etching. In this embodiment, even if a space is generated in the portion of the resist pattern 106 which intersects with the first wiring pattern 103 during printing of the resist pattern 106, the space can be eliminated by softening the resist pattern 106. Therefore, it is possible to prevent occurrence of disconnection and defects in a portion of the upper second wiring pattern, which intersects with the first wiring pattern 103, in etching and patterning of the second wiring metal film 105.

Figure 3A:
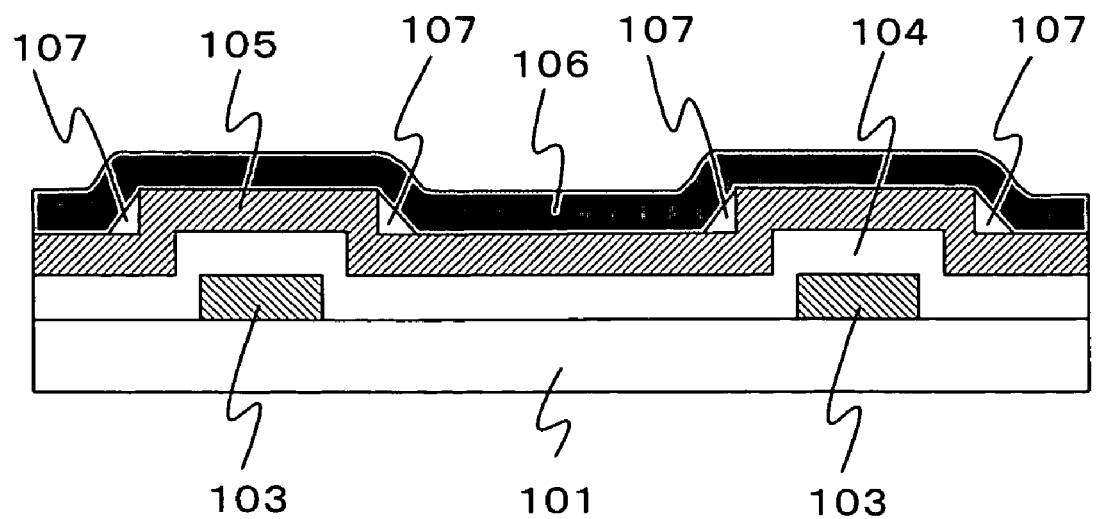
FIGS. 3A and 3B are cross-sectional views along the line I-I in FIG. 2F, showing advantages of softening a resist pattern in the method of forming a wiring according to the first typical embodiment of the present invention.
Figure 3B:
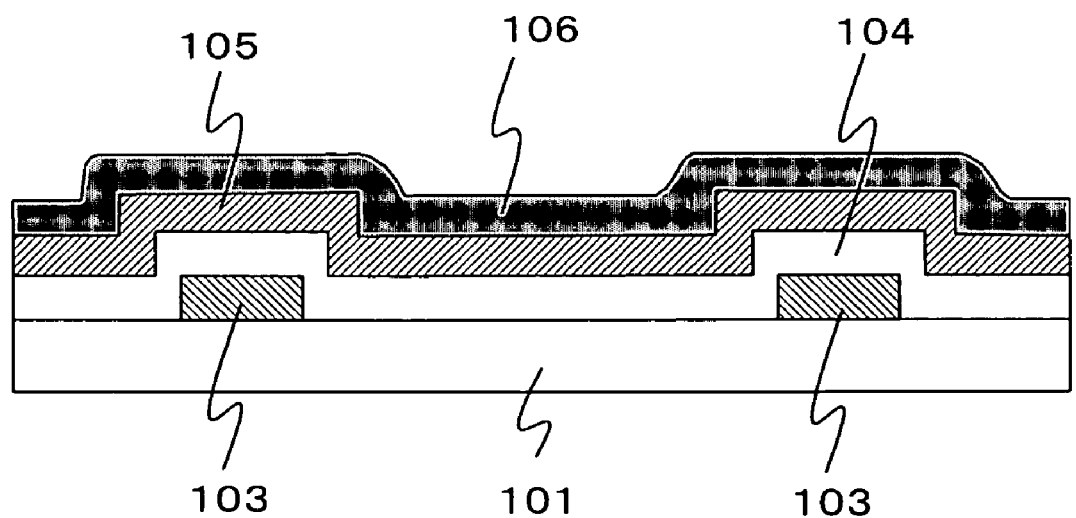

FIGS. 3A and 3B are cross-sectional views along the line I-I in FIG. 2F, showing advantages of softening the resist pattern 106 in this embodiment. As shown in FIG. 3A, when the resist pattern 106 is formed on the second wiring metal film 105, the resist pattern 106 intersects with the second wiring pattern 103. Accordingly, spaces 107 may be generated in the resist pattern 106 formed in a step part of the second wiring metal film 105. By softening the resist pattern 106 as described above after printing of the resist pattern 106, the spaces 107 can be eliminated as shown in FIG. 3B. Thus, disconnection and defects are prevented from occurring in the portion of the upper second wiring pattern, which intersects with the first wiring pattern 103, in etching and patterning of the second wiring metal film 105.

Typical Embodiment 2

Figure 4A:
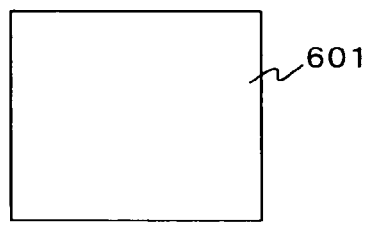
FIGS. 4A to 4F are plan views of a main part of a substrate, showing steps of a method of forming a wiring according to a second typical embodiment of the present invention.

Next, with reference to FIGS. 4A to 4F, description will be given of a method of forming a wiring according to a second typical embodiment of the present invention. First, as shown in FIG. 4A, an insulating substrate 601 such as a glass substrate is prepared. Next, as shown in FIG. 4B, a wiring metal film 602 is deposited on the entire surface of the insulating substrate 601. As the wiring metal film 602, a laminated film can be used, which is formed of one selected from a group including Cr, Ta, Mo and Ti, and an aluminum alloy film such as Al—Nd and Al—Ta. The wiring metal film 602 has a thickness of 200 nm to 1000 nm. Next, as shown in FIG. 4C, an unnecessary portion of the wiring metal film 602 is etched by wet etching or dry etching using a resist as a mask. Thus, a first wiring pattern 603 is formed. Note that the first wiring pattern 603 may be formed by using a screen printing method to directly print a conductive resin onto the insulating substrate 601.

Figure 4D:
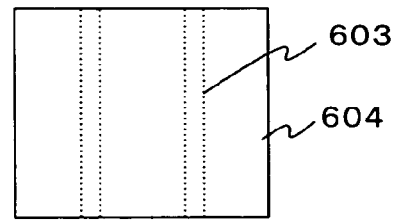
Figure 4B:
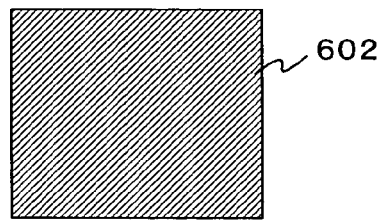
Figure 4E:
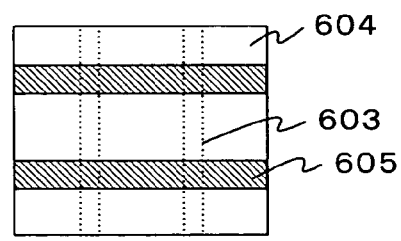
Figure 4C:
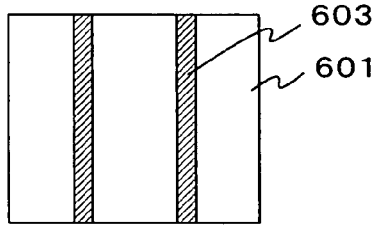

Next, as shown in FIG. 4D, an interlayer insulating film 604 having a thickness of 200 to 1000 nm is deposited on the entire surface of the insulating substrate 601 having the first wiring pattern 603 formed thereon. As the interlayer insulating film 604, a nitride film or an oxide film is used. Thereafter, as shown in FIG. 4E, a conductive resin pattern 605 for a second wiring pattern is formed on the interlayer insulating film 604. Specifically, the conductive resin pattern 605 is formed by printing conductive resin ink containing fine metal particles in a thickness of 2 to 5 μm by use of the screen printing method. As the fine metal particles, Ag, Al, Mo, Cr or the like, which has an average particle diameter of 200 nm or less, preferably, 1 to 100 nm, for example, can be used. The conductive resin ink is prepared by mixing the fine metal particles selected from those described above with a thermosetting resin, such as an epoxy resin and a polyimide resin, and an organic solvent. Thereafter, the solvent in the conductive resin pattern 605 is vaporized by air drying, and the conductive resin pattern 605 is dried. In order to hasten drying of the conductive resist pattern 605, the conductive resist pattern 605 can also be dried by heating at a temperature of 30 to 50° C. in a drying furnace.

As a method of softening the conductive resist pattern 605, a solvent exposure processing method of exposing the substrate in an organic solvent atmosphere or a heat treatment method using a temperature lower than a curing temperature of the resin of the conductive resist pattern 605 can be used. As the solvent exposure processing method, it is possible to use a method of exposing the insulating substrate 601 in an organic solvent atmosphere of about 0.01% to 10% for about 10 to 120 seconds.

Figure 4F:
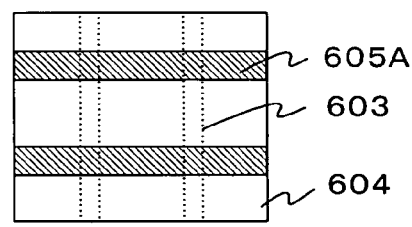

Moreover, as the heat treatment method, it is possible to use a method of holding the insulating substrate 601 at a temperature of about 50 to 100° C., for example, for about 10 to 120 seconds. In a portion of the conductive resist pattern 605 which intersects with the wiring pattern 603, a space is likely to be generated. However, the space can be repaired by the softening described above. Thereafter, as shown in FIG. 4F, the conductive resist pattern 605 is hardened at a temperature of 120 to 200° C. Thus, a second wiring pattern 605A is formed.

Typical Embodiment 3

Figure 5A:
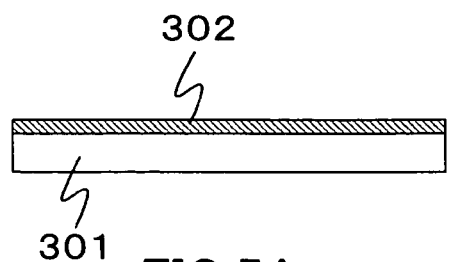
FIGS. 5A to 5J are cross-sectional views of a main part of a substrate, showing steps of a method of manufacturing a TFT substrate according to a third typical embodiment of the present invention.

With reference to FIGS. 5A to 6J, description will be given of a method of manufacturing a TFT substrate according to a third typical embodiment of the present invention. First, as shown in FIG. 5A, a gate wiring film 302 is deposited on an insulating substrate 301 such as a glass substrate. As the gate wiring film 302, a laminated film can be used, which is formed of one selected from a group including Cr, Ta, Mo and Ti, and an aluminum alloy film such as Al—Nd and Al—Ta. Next, as shown in FIG. 5B, a resist pattern 303 having a thickness of 2 to 5 μm is formed by use of a screen printing method. By using the resist pattern 303 as a mask, as shown in FIG. 5C, the gate wiring film 302 is etched to pattern a gate wiring 302A. Thereafter, as shown in FIG. 5D, the resist pattern 303 on the gate wiring 302A is removed. Next, as shown in FIG. 5E, a gate insulating film 304 and a semiconductor film 305 are sequentially deposited on the insulating substrate 301 having the gate wiring 302A formed thereon.

As the gate insulating film 304, a nitride film or an oxide film is deposited to have a thickness of 200 to 1000 nm.

Figure 5F:
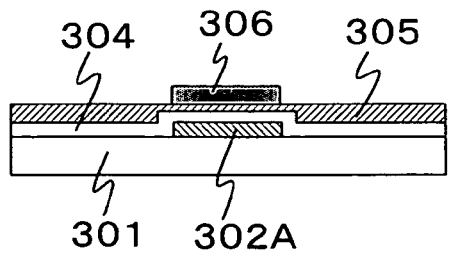
Figure 5B:
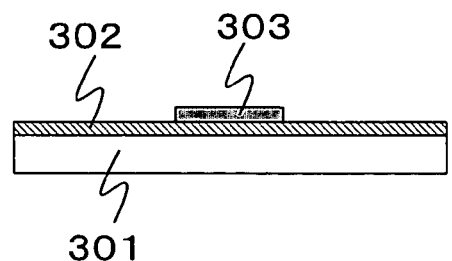

As the semiconductor film 305, a laminated film is used, which is formed of an amorphous silicon film having a thickness of 106 to 400 nm and an amorphous silicon film which has a thickness of 30 to 100 nm and is doped with impurities. On the semiconductor film 305, a resist pattern 306 having a thickness of 2 to 5 μm is formed by screen printing, as shown in FIG. 5F. Thereafter, the resist pattern 306 is air-dried to vaporize a solvent in the resist pattern 306. Thus, the resist pattern 306 is dried. In order to hasten drying of the resist pattern 306, the resist pattern 306 can also be dried by heating at a temperature of 30 to 50° C. in a drying furnace. Thereafter, the resist pattern 306 is softened by exposing the insulating substrate 301 having the resist pattern 306 formed thereon in an organic solvent atmosphere, in which predetermined temperature and vapor pressure are maintained, for about 10 to 120 seconds. Subsequently, the substrate is hardened by use of a hot plate or the like, which is maintained at a predetermined temperature.

Figure 5G:
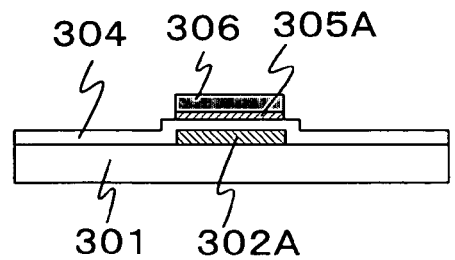
Figure 5C:
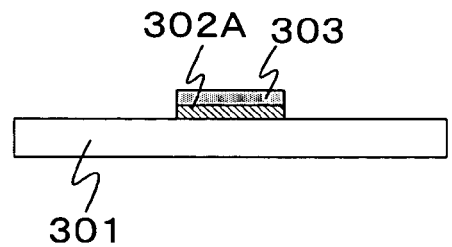
Figure 5H:
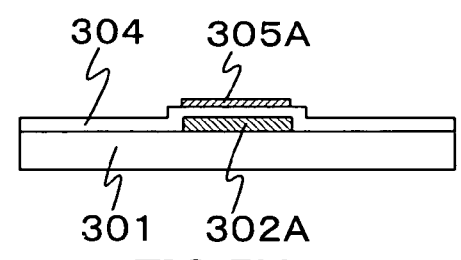
Figure 5D:
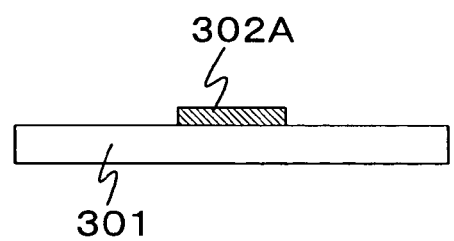
Figure 5I:
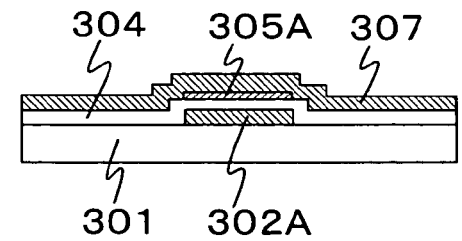
Figure 5E:
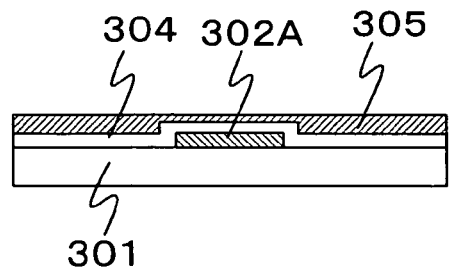
Figure 5J:
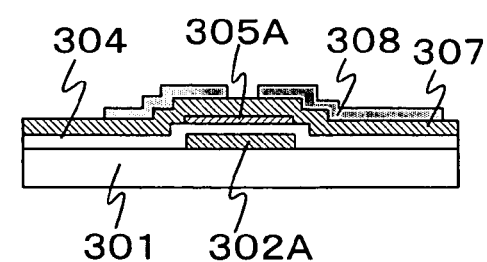

Note that, as a method of softening the resist pattern 306, it is also possible to use a heat treatment method of holding the substrate at a temperature lower than a curing temperature of a resist material of the resist pattern 306, for example, at a temperature of 50 to 100° C. for about 10 to 120 seconds. Next, as shown in FIG. 5G, a portion of the semiconductor film 305, which is not covered with the resist pattern 306, is removed by etching to pattern a semiconductor film pattern 305A. Thereafter, as shown in FIG. 5H, the resist pattern 306 on the semiconductor film pattern 305A is removed. Next, as shown in FIG. 5I, a conductive film 307 having a thickness of 30 to 400 nm for source and drain wirings is deposited on the gate insulating film 304 including the semiconductor film. As the conductive film 307, a metal film such as Al, Mo and Cr can be used. Thereafter, as shown in FIG. 5J, a resist pattern 308 is screen-printed onto the conductive film 307 and is air-dried to vaporize a solvent in the resist pattern 308. Accordingly, the resist pattern 308 is dried. In order to hasten drying of the resist pattern 308, the resist pattern 308 can also be dried by heating at a temperature of 30 to 50° C. in a drying furnace. Thereafter, the resist pattern 308 is softened by exposing the insulating substrate 301 having the resist pattern 308 formed thereon in an organic solvent atmosphere, in which predetermined temperature and vapor pressure are maintained, for about 10 to 120 seconds. Subsequently, the resist pattern 308 is hardened by holding the insulating substrate 301 on a hot plate heated to a predetermined temperature.

Figure 6A:
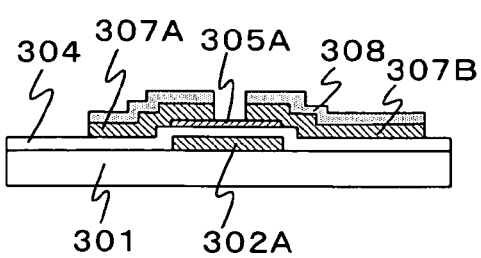
FIGS. 6A to 6J are cross-sectional views of the main part of the substrate, showing steps subsequent to FIG. 5J of the method of manufacturing a TFT substrate according to the third typical embodiment of the present invention.
Figure 6F:
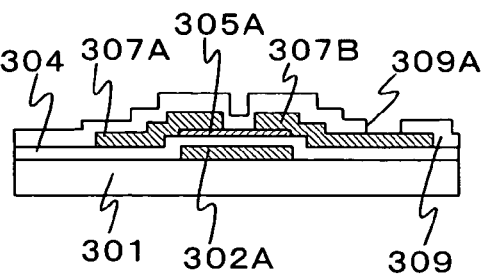
Figure 6B:
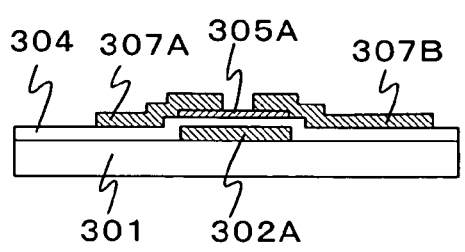
Figure 6G:
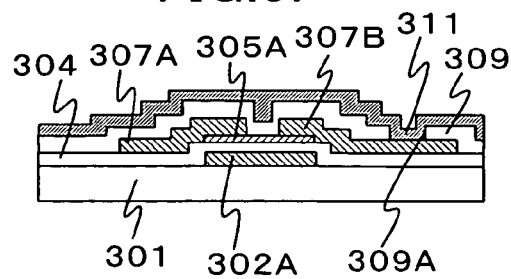
Figure 6C:
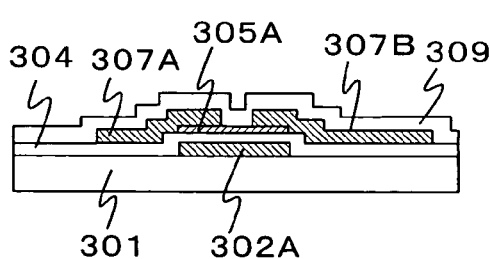
Figure 6H:
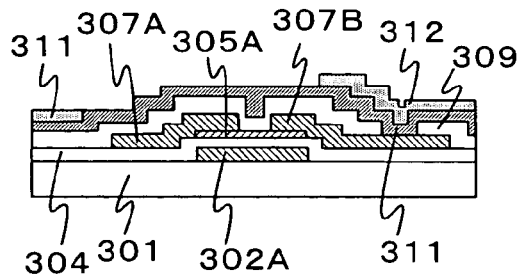
Figure 6D:
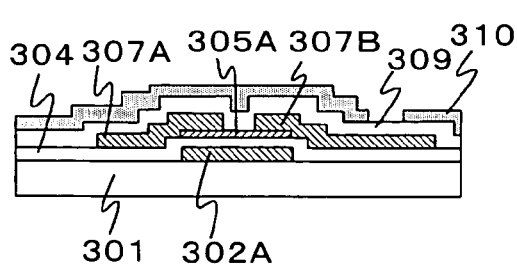

Note that, as a method of softening the resist pattern 308, it is also possible to use a heat treatment method of holding the substrate at a temperature lower than a curing temperature of a resist material of the resist pattern 308, for example, at a temperature of 50 to 100° C. for about 10 to 120 seconds. Next, as shown in FIG. 6A, a portion of the conductive film 307, which is not covered with the resist pattern 308, is removed by etching. Thus, source and drain electrodes 307A and 307B of a TFT are formed. Thereafter, as shown in FIG. 6B, the resist pattern 308 is removed. Next, as shown in FIG. 6C, an insulating film 309 made of a nitride film having a thickness of 100 to 250 nm is deposited on the entire surface over the insulating substrate 301. Thereafter, as shown in FIG. 6D, a resist pattern 310 for forming a contact hole is screen-printed onto the insulating film 309. Subsequently, a solvent in the resist pattern 310 is vaporized by air drying, and the resist pattern 310 is dried. Thereafter, the resist pattern 310 is softened by exposing the insulating substrate 301 in an organic solvent atmosphere, in which predetermined temperature and vapor pressure are maintained, for a desired period of time. Subsequently, the resist pattern 310 is hardened by holding the substrate on a hot plate heated to a predetermined temperature.

Figure 6I:
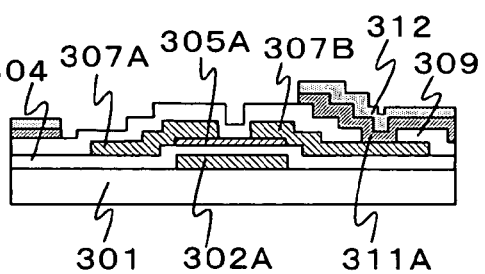
Figure 6E:
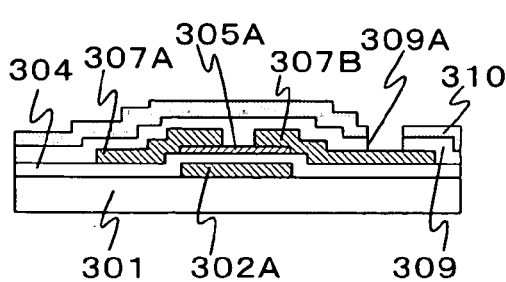

Note that, as a method of softening the resist pattern 310, it is also possible to use a heat treatment method of holding the substrate at a temperature lower than a curing temperature of a resist material of the resist pattern 310, for example, at a temperature of 50 to 100° C. for about 10 to 120 seconds. Next, as shown in FIG. 6E, a portion of the insulating film 309, which is not covered with the resist pattern 310, is removed by etching. Thus, an opening 309A for a contact hole is formed. Thereafter, as shown in FIG. 6F, the resist pattern 310 is removed. Next, as shown in FIG. 6G, an ITO film 311 for forming a pixel electrode is deposited on the entire surface. Thereafter, as shown in FIG. 6H, a resist pattern 312 for forming a pixel electrode is formed by screen printing on the ITO film 311. Subsequently, a solvent in the resist pattern 312 is vaporized by air drying, and the resist pattern 312 is dried. Thereafter, the resist pattern 312 is softened by exposing the insulating substrate 301 in an organic solvent atmosphere, in which predetermined temperature and vapor pressure are maintained, for a desired period of time.

Figure 6J:
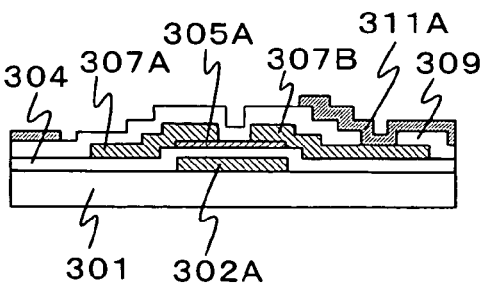

Note that, as a method of softening the resist pattern 312, it is also possible to use a heat treatment method of holding the substrate at a temperature lower than a curing temperature of a resist material of the resist pattern 312, for example, at a temperature of 50 to 100° C. for about 10 to 120 seconds. Thereafter, the resist pattern 312 is hardened by holding the substrate on a hot plate heated to a predetermined temperature. Next, a portion of the ITO film 311, which is not covered with the resist pattern 312, is removed by etching. Thus, as shown in FIG. 6I, a pixel electrode 311A is formed. Thereafter, as shown in FIG. 6J, the resist pattern 312 on the pixel electrode 311A is removed. Subsequently, an orientation film (not shown) which is made of a polyimide resin is formed on the entire surface over the insulating substrate 301 including the surface of the pixel electrode 311A. Thus, a TFT substrate is completed.

Figure 7A:
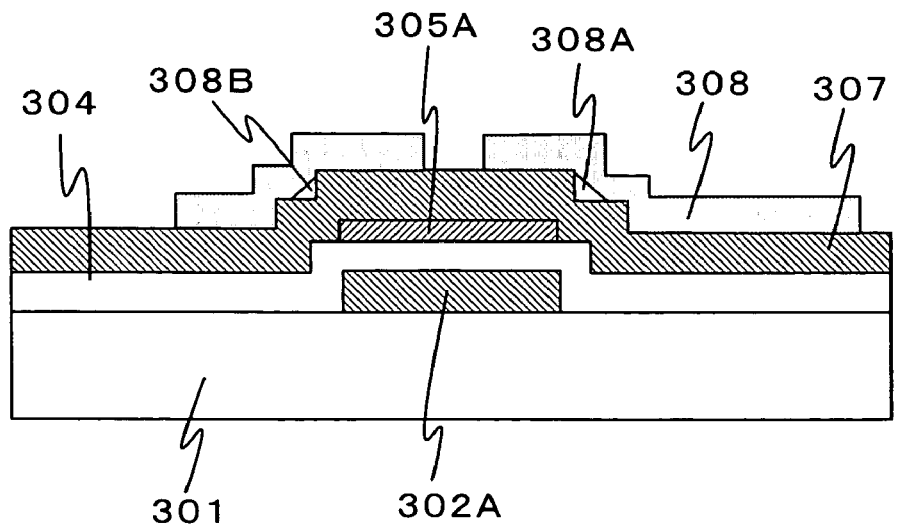
FIGS. 7A to 7C are cross-sectional views of the main part of the substrate, showing advantages of softening a resist pattern in the step of FIG. 5J.
Figure 7B:
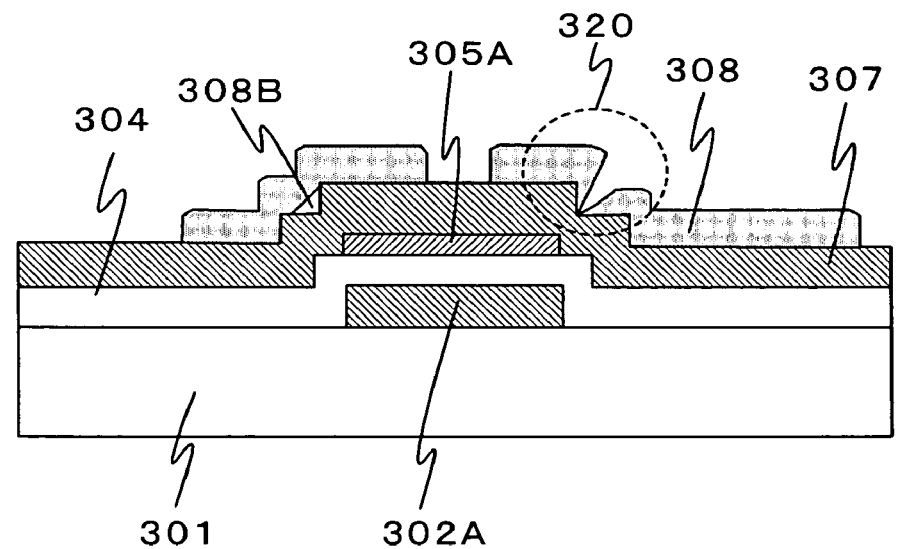
Figure 7C:
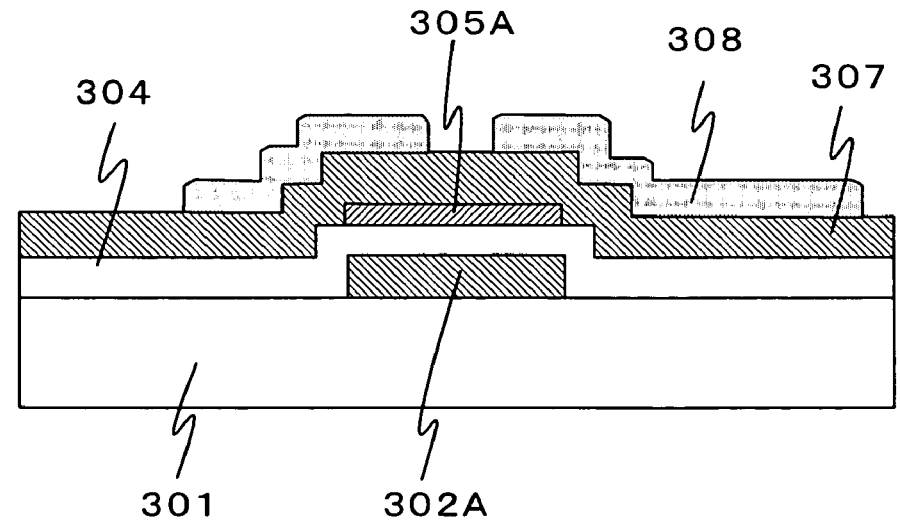

In the embodiment described above, in the steps shown in FIGS. 5F, 5J, 6D and 6H, after the resist patterns are formed by screen printing and dried, the resist patterns are softened by being exposed in the organic solvent atmosphere for the desired period of time. As to advantages of softening the resist patterns, softening in the step shown in FIG. 5J will be described as a typical example. FIGS. 7A to 7C are cross-sectional views of the main part of the substrate, showing the advantages of softening the resist pattern in the step of FIG. 5J. Reference numerals in FIGS. 7A to 7C which are the same as those in FIG. 5J denote the same parts. As shown in FIG. 7A, on the conductive film 307 formed over the gate wiring 302A on the insulating substrate 301, the resist pattern 308 is formed by screen printing. The resist pattern 308 is air-dried to vaporize the solvent in the resist pattern 308. Thus, the resist pattern 308 is dried. Since the resist pattern 308 has a high viscosity, spaces 308A and 308B are likely to be generated in the resist pattern 308 formed in a step part of the conductive film 307. As shown in FIG. 7B, the space 308A may be deformed to cause a defect portion 320 of the resist pattern. If the resist pattern 308 is abruptly hardened after air-drying thereof, the space 308B and the defect portion 320 of the resist pattern are left without being repaired. Accordingly, a problem-occurs that the conductive film 307 is etched more than necessary in patterning of the underlying conductive film 307 by etching. Thus, in this embodiment, before hardening of the resist pattern 308, the resist pattern 308 is softened by being exposed in the organic solvent atmosphere in which the predetermined temperature and vapor pressure are maintained.

Note that, as shown in FIG. 7C, by softening the resist pattern 308, the space 308B and the defect portion 302 which exist in the resist pattern 308 are repaired. Thus, it is possible to prevent etching failure (disconnection or defects such as narrowed wirings) of the conductive film 307.

Typical Embodiment 4

Figure 8A:
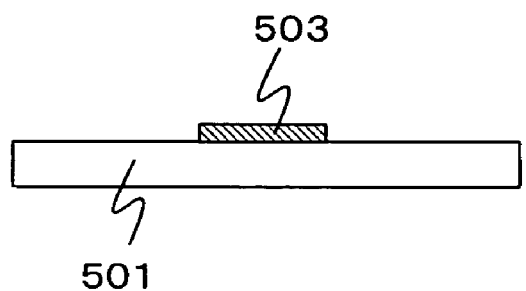
FIGS. 8A to 8E are cross-sectional views of a main part of a substrate, showing steps of a method of manufacturing a TFT substrate according to a fourth typical embodiment of the present invention.

Next, with reference to FIGS. 8A to 9G, description will be given of a method of manufacturing a TFT substrate according to a fourth typical embodiment of the present invention. First, as shown in FIG. 8A, on an insulating substrate 501 such as a glass substrate, conductive resin ink containing fine metal particles is printed in a thickness of 2 to 5 µm by use of a screen printing method. Thus, a gate wiring pattern 503 is formed. As the fine metal particles, Ag, Al, Mo, Cr or the like, which has an average particle diameter of 200 nm or less, preferably, 1 to 100 nm, for example, can be used. The conductive resin ink is prepared by mixing the fine metal particles selected from those described above with a thermosetting resin, such as an epoxy resin and a polyimide resin, and an organic solvent. The gate wiring pattern 503 made of a conductive resin is dried by air drying. Thereafter, the gate wiring pattern 503 made of the conductive resin is hardened at a temperature of 120 to 200° C.

Figure 8B:
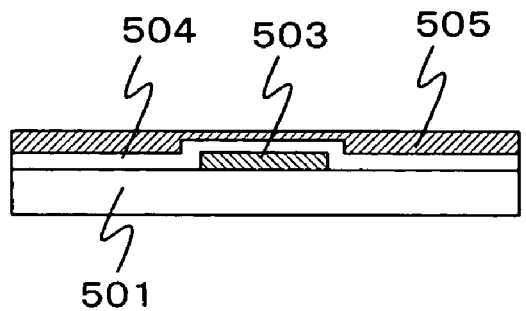
Figure 8C:
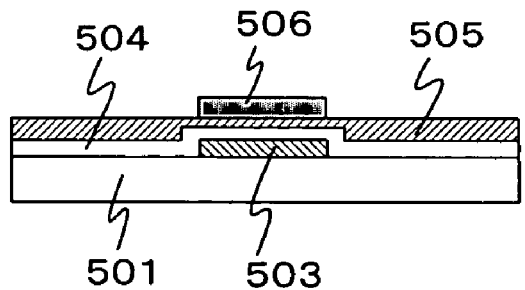

Next, as shown in FIG. 8B, a gate insulating film 504 and a semiconductor film 505 are sequentially deposited on the insulating substrate 501 having the gate wiring pattern 503 formed thereon. As the gate insulating film 504, a nitride film or an oxide film is deposited to have a thickness of 200 to 1000 nm. As the semiconductor film 505, a laminated film is used, which is formed of an amorphous silicon film having a thickness of 100 to 400 nm and an amorphous silicon film which has a thickness of 30 to 100 nm and is doped with impurities. On the semiconductor film 505, a resist pattern 506 having a thickness of 2 to 5 µm is formed by screen printing, as shown in FIG. 8C. Thereafter, the resist pattern 506 is air-dried to vaporize a solvent in the resist pattern 506. Thus, the resist pattern 506 is dried. In order to hasten drying of the resist pattern 506, the resist pattern 506 can also be dried by heating at a temperature of 30 to 50° C. in a drying furnace. Thereafter, the resist pattern 506 is softened by exposing the insulating substrate 501 having the resist pattern 506 formed thereon in an organic solvent atmosphere, in which predetermined temperature and vapor pressure are maintained, for about 10 to 120 seconds.

Figure 8D:
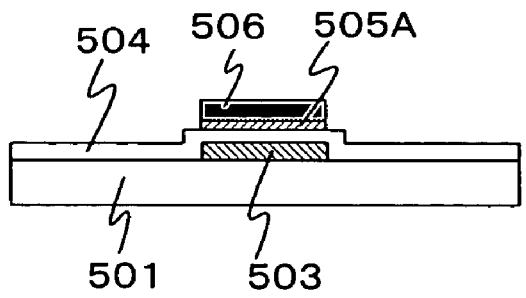
Figure 8E:
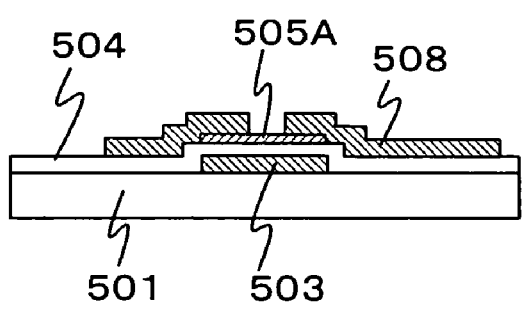

Note that, as a method of softening the resist pattern 506, it is also possible to use a heat treatment method of holding the substrate at a temperature lower than a curing temperature of a resist material of the resist pattern 506, for example, at a temperature of 50 to 100° C. for about 10 to 120 seconds. Thereafter, the substrate is hardened by use of a hot plate or the like, which is maintained at a predetermined temperature. Next, as shown in FIG. 8D, a portion of the semiconductor film 505, which is not covered with the resist pattern 506, is removed by etching to pattern a semiconductor film pattern 505A. Thereafter, the resist pattern 506 on the semiconductor film pattern 505A is removed. Subsequently, as shown in FIG. 8E, a conductive resin pattern 508 for source and drain wirings is formed to have a thickness of 2 to 5 µm by use of the screen printing method on the gate insulating film 504 including the semiconductor film pattern 505A. A conductive resin is prepared by mixing metal particles such as Ag, Al, Mo and Cr with an average particle diameter of 200 nm or less, preferably, 1 to 100 nm with a thermosetting resin, such as an epoxy resin and a polyimide resin, and an organic solvent. The conductive resin pattern 508 is air-dried to vaporize the solvent in the conductive resin pattern 508. Thus, the conductive resin pattern 508 is dried. Thereafter, the conductive resin pattern 508 is softened by exposing the insulating substrate 501 having the conductive resin pattern 508 formed thereon in an organic solvent atmosphere, in which predetermined temperature and vapor pressure are maintained, for about 10 to 120 seconds.

Figure 9A:
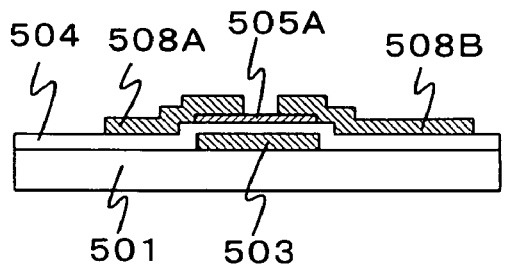
FIGS. 9A to 9G are cross-sectional views of the main part of the substrate, showing steps subsequent to FIG. 8E of the method of manufacturing a TFT substrate according to the fourth typical embodiment of the present invention.
Figure 9E:
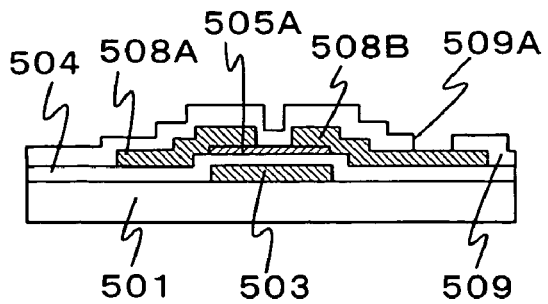
Figure 9B:
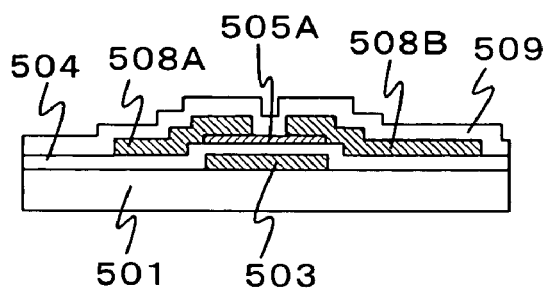
Figure 9F:
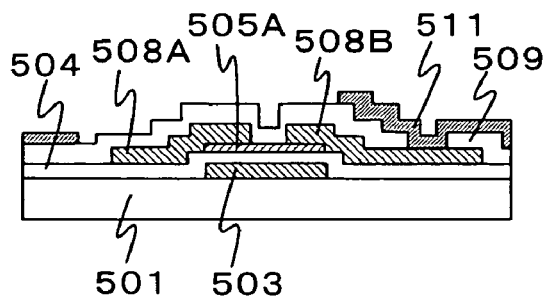
Figure 9C:
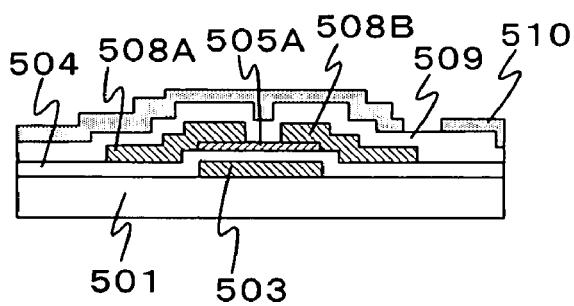

Note that, as a method of softening the conductive resin pattern 508, it is also possible to use a heat treatment method of holding the substrate at a temperature lower than a curing temperature of a resin material of the conductive resin pattern 508, for example, at a temperature of 50 to 100° C. for about 10 to 120 seconds. Thereafter, the conductive resin pattern 508 is hardened by holding the insulating substrate 501 on a hot plate heated to a predetermined temperature. Thus, as shown in FIG. 9A, a source electrode 508A and a drain electrode 508B are formed. Next, as shown in FIG. 9B, an insulating film 509 made of a nitride film having a thickness of 100 to 250 nm is deposited on the entire surface over the insulating substrate 501. Thereafter, as shown in FIG. 9C, a resist pattern 510 for forming a contact hole is screen-printed onto the insulating film 509. Subsequently, a solvent in the resist pattern 510 is vaporized by air drying, and the resist pattern 510 is dried. Thereafter, the resist pattern 510 is softened by exposing the insulating substrate 501 in an organic solvent atmosphere, in which predetermined temperature and vapor pressure are maintained, for a desired period of time.

Figure 9G:
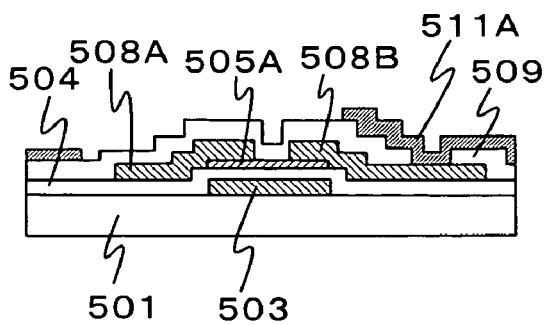
Figure 9D:
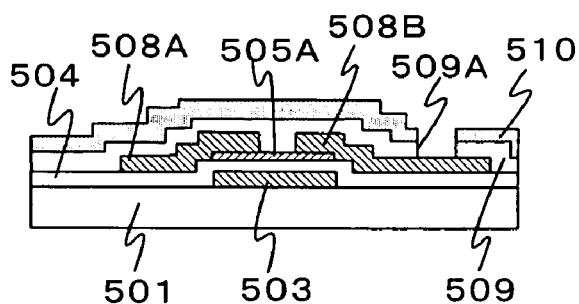

Note that, as a method of softening the resist pattern 510, it is also possible to use a heat treatment method of holding the substrate at a temperature lower than a curing temperature of a resist material of the resist pattern 510, for example, at a temperature of 50 to 100° C. for about 10 to 120 seconds. Thereafter, the resist pattern 510 is hardened by holding the insulating substrate 501 on a hot plate heated to a predetermined temperature. Next, as shown in FIG. 9D, a portion of the insulating film 509, which is not covered with the resist pattern 510, is removed by etching. Thus, an opening 509A for a contact hole is formed. Thereafter, as shown in FIG. 9E, the resist pattern 510 is removed. Next, as shown in FIG. 9F, a conductive resin pattern 511 including an indium tin oxide film (ITO film) for forming a pixel electrode is formed by screen printing on the insulating film 509 including inside of the opening 509A. Thereafter, a solvent in the conductive resin pattern 511 is vaporized by air drying, and the conductive resin pattern 511 is dried. Thereafter, the conductive resin pattern 511 is softened by exposing the insulating substrate 501 in an organic solvent atmosphere, in which predetermined temperature and vapor pressure are maintained, for a desired period of time.

Note that, as a method of softening the conductive resin pattern 511, it is also possible to use a heat treatment method of holding the substrate at a temperature lower than a curing temperature of a resin material of the conductive resin pattern 511, for example, at a temperature of 50 to 100° C. for about 10 to 120 seconds. Thereafter, the conductive resin pattern 511 is hardened by holding the substrate on a hot plate heated to a predetermined temperature. Thus, as shown in FIG. 9G, a pixel (not shown) which is made of a polyimide resin is formed on the entire surface over the insulating substrate 501 including the surface of the pixel electrode 511A. Thus, a TFT substrate is completed.

Note that it is also possible to form the pixel electrode in such a manner that the indium tin oxide film for forming a pixel electrode is deposited on the insulating film 509 by vapor deposition and the indium tin oxide film is patterned by etching. The method of forming a wiring pattern and the method of manufacturing a TFT substrate according to the present invention have been described above based on the embodiments. It is needless to say that the method of forming a wiring pattern of the present invention can also be applied to a method of manufacturing an active matrix substrate for a liquid crystal display using a switching element other than the TFT.

While this invention has been described in connection with certain preferred embodiments, it is to be understood that the subject matter encompassed by way of this invention is not to be limited to those specific embodiments. On the contrary, it is intended for the subject matter of the invention to include all alternative, modification and equivalents as can be included within the spirit and scope of the following claims.

What is claimed is:

1. A method of forming a wiring pattern, comprising:
    forming a first conductive film pattern made of a first conductive film on an insulating substrate; and
    forming a second conductive film pattern made of a second conductive film, the second conductive film pattern intersecting with the first conductive film pattern, on the first conductive film with an insulating film interposed therebetween,
    wherein forming the second conductive film pattern includes:
        forming the insulating film covering the first conductive film pattern on the entire surface of the insulating substrate having the first conductive film pattern formed thereon, forming the second conductive film on the insulating film, wherein a step part is formed from intersecting the first conductive film pattern;
        forming a resist pattern, directly on the second conductive film so as to cover the step part thereof by use of a screen printing method;
        softening the resist pattern after drying the resist pattern to eliminate a space formed between said step part of the second conductive film and said resist pattern;
        hardening the resist pattern; and
        forming the second conductive film pattern intersecting with the first conductive film pattern, by etching and patterning the second conductive film by use of the resist pattern as a mask,
    wherein the softening the resist pattern comprises heating the resist pattern at a temperature lower than a curing temperature of a resist material of the resist pattern.

2. The method of forming a wiring pattern, according to claim 1, wherein the insulating substrate comprises a glass substrate.

3. The method of forming a wiring pattern, according to claim 1, wherein the softening the resist pattern comprises heat-treating the resist pattern at a temperature between 50 degrees to 90 degrees Celsius for a period of time of about 10 seconds to 120 seconds.

4. The method of manufacturing a thin film transistor substrate, according to claim 1, wherein the softening the etching resist pattern includes exposing the etching resist pattern in an organic solvent atmosphere comprising exposing the resist pattern to an organic solvent atmosphere comprising about 0.01% to 10% organic solvent for a period of time of 10 seconds to 120 seconds.

5. A method of forming a wiring pattern, comprising:
    forming a first conductive film pattern made of a first conductive film on an insulating substrate; and forming a second conductive film pattern made of a second conductive film, which intersects with the first conductive film pattern, on the first conductive film with an insulating film interposed therebetween, wherein forming the second conductive film pattern includes:

forming the insulating film covering the first conductive film pattern on the entire surface of the insulating substrate having the first conductive film pattern formed thereon, wherein a step part is formed from intersecting the first conductive film pattern;

forming the second conductive film pattern intersecting with the first conductive film pattern, by screen-printing a conductive paste on the insulating film so as to cover the step part thereof;

softening the second conductive film pattern after drying the second conductive film pattern to eliminate a space formed between the step part of the insulating film and the second conductive film pattern; and hardening the second conductive film pattern, wherein softening the second conductive film pattern includes exposing the second conductive film pattern in an organic solvent atmosphere.

6. The method of forming a wiring pattern, according to claim 5, wherein the insulating substrate comprises a glass substrate.

7. The method of forming a wiring pattern, according to claim 5, wherein the conductive paste comprises metal particles selected from a group consisting of Ag, Al, Mo and Cr.

8. A method of manufacturing a thin film transistor substrate, comprising:

forming a gate wiring on an insulating substrate;

forming a gate insulating film covering the gate wiring, on the insulating substrate;

depositing a semiconductor film on the gate insulating film, and forming a semiconductor film pattern by etching and patterning the semiconductor film; and depositing a metal film covering the semiconductor film pattern, on the gate insulating film, wherein a step part is formed from intersecting the semiconductor film pattern, and forming source and drain electrodes made of the metal film connected to the semiconductor film pattern by etching and patterning the metal film, wherein at least one etching resist pattern of the semiconductor film and the metal film is formed on the metal film so as to cover the step part thereof by screen printing and the at least one etching resist pattern of the semiconductor film and the metal film is softened after being dried, but the softening is performed before hardening the at least one etching resist pattern of the semiconductor film and the metal film to eliminate a space formed between the step part of the metal film and said resist pattern.

9. The method of manufacturing a thin film transistor substrate, according to claim 8, wherein the insulating substrate comprises a glass substrate.

10. A method of manufacturing a thin film transistor substrate, comprising:

forming a gate wiring on an insulating substrate;

forming a gate insulating film, which covers the gate wiring, on the insulating substrate;

forming a semiconductor film pattern on the gate insulating film, wherein a step part is formed from intersecting the gate wiring; and forming source and drain electrodes containing a metal material connected to the semiconductor film pattern on the gate insulating film, wherein forming the source and drain electrodes includes forming a conductive film pattern by screen-printing a conductive paste on the semiconductor film pattern so as to cover the step part thereof, softening the conductive film pattern after drying thereof to eliminate a space formed between the step part of the semiconductor film pattern and the conductive film pattern, and hardening the conductive film pattern.

11. The method of manufacturing a thin film transistor substrate, according to claim 10, wherein the softening the conductive film pattern includes exposing the conductive film pattern in an organic solvent atmosphere.

12. The method of manufacturing a thin film transistor substrate, according to claim 10, wherein the softening the conductive film pattern includes heat-treating the conductive film pattern at a temperature lower than a curing temperature of the conductive paste of the conductive film pattern.

13. The method of manufacturing a thin film transistor substrate, according to claim 10, wherein the conductive paste comprises metal particles selected from a group consisting of Ag, Al, Mo and Cr.

14. The method of manufacturing a thin film transistor substrate, according to claim 10, wherein the insulating substrate comprises a glass substrate.

15. A method of manufacturing a thin film transistor substrate, comprising:

depositing a gate wiring on an insulating substrate;

forming a layer over the gate wiring, wherein a step part is formed from intersecting the gate wiring;

forming a resist pattern on the layer so as to cross cover the step part thereof by use of a screen printing method, the resist pattern comprising an insulating thermosetting resin;

softening the resist pattern to eliminate a space formed between the step part of the layer and the resist pattern, then etching an exposed portion of the layer and removing the resist pattern exposing a remaining portion of the layer;

depositing a source and drain wiring conductive pattern onto the remaining portion of the layer, the source and drain wiring conductive pattern comprising a first conductive thermosetting resin;

forming an insulating layer on the source and drain wiring conductive pattern, wherein a step part is formed from intersecting the source and drain wiring conductive pattern;

forming a resist layer over the insulating layer so as to cover the step part thereof by use of a screen printing method, the resist layer comprising a second insulating thermosetting resin;

softening the resist layer to eliminate a space formed between the step part of the insulating layer and the resist pattern;

etching an exposed portion of the insulating layer and then removing the resist layer;

forming a conductive pattern to form a pixel electrode on the insulating layer so as to cover the step part thereof by use of a screen printing method, the conductive pattern comprising a third thermosetting resin; and softening the conductive pattern to eliminate a space formed between the step part of the insulating layer and the conductive pattern.

16. The method of claim 15, further comprising drying of the resist layer thermosetting resin formed over the insulating layer before the softening of the resist layer.

* * * * *